US012620996B2

(12) United States Patent
Terasaki

(10) Patent No.: US 12,620,996 B2
(45) Date of Patent: May 5, 2026

(54) SIGNAL PROCESSOR WITH A-D CONVERTER AND RESERVOIR UNIT

(71) Applicant: TDK CORPORATION, Tokyo (JP)

(72) Inventor: Yukio Terasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 182 days.

(21) Appl. No.: 18/240,854

(22) Filed: Aug. 31, 2023

(65) Prior Publication Data

US 2024/0178854 A1      May 30, 2024

Related U.S. Application Data

(63) Continuation-in-part of application No. PCT/JP2022/043731, filed on Nov. 28, 2022.

(51) Int. Cl.
$H03M\ 1/12$          (2006.01)
$H03M\ 1/50$          (2006.01)

(52) U.S. Cl.
CPC ........... $H03M\ 1/1245$ (2013.01); $H03M\ 1/50$ (2013.01)

(58) Field of Classification Search
CPC .......... G06N 3/06; G06N 3/0617; G06N 3/04; G06N 3/063; G06N 3/0445; H03M 1/0607; H03M 1/08; H03M 1/785
USPC ........................................................ 341/155
See application file for complete search history.

(56) References Cited

U.S. PATENT DOCUMENTS

| | | | | |
|---|---|---|---|---|
| 10,153,806 | B1 * | 12/2018 | Petre ......................... | G06N 3/08 |
| 10,348,319 | B1 * | 7/2019 | Monangi ................. | H03M 1/08 |
| 11,436,480 | B2 * | 9/2022 | Takeda .................... | G06N 3/044 |
| 2019/0120932 | A1 | 4/2019 | Smith et al. | |
| 2020/0334516 | A1 | 10/2020 | Tai et al. | |
| 2021/0232910 | A1 * | 7/2021 | Takeda ................. | G06N 3/0675 |
| 2021/0406648 | A1 * | 12/2021 | Lathrop ................... | G06N 3/08 |

FOREIGN PATENT DOCUMENTS

| | | |
|---|---|---|
| EP | 4 134 882 A1 | 2/2023 |
| JP | 2019-090795 A | 6/2019 |
| JP | 2020-177509 A | 10/2020 |
| WO | 2021/205581 A1 | 10/2021 |
| WO | 2022/024167 A1 | 2/2022 |

OTHER PUBLICATIONS

Kanno, Kazutaka; "Reinforcement learning based on photonic reservoir computing;" Extended Abstracts of the 68th JSAP Meeting 2021; Japan Society of Applied Physics; 2021.
Hülser et al.; "Deriving task specific performance from the information processing capacity of a reservoir computer;" Nanophotonics; 2023; pp. 937-947; vol. 12, No. 5.

(Continued)

*Primary Examiner* — Peguy Jean Pierre
(74) *Attorney, Agent, or Firm* — Oliff PLC

(57)          ABSTRACT
A signal processor includes an input unit, an analog-digital converter, and a reservoir unit. The input unit receives an input of a first analog signal. The analog-digital converter converts the first analog signal to a first digital signal. The reservoir unit receives an input of at least a part of the first digital signal. The reservoir unit determines a rule of a timing at which a control signal for extracting a part of the first analog signal or the first digital signal is output.

19 Claims, 7 Drawing Sheets

(56) References Cited

OTHER PUBLICATIONS

Reservoir Computing; Morikita Publishing Co., Ltd.; 2021; ISBN: 978-4-627-85531-1.
Carroll, T.L.; "Optimizing Memory in Reservoir Computers;" Chaos; 2021; pp. 1-46.
Feb. 14, 2023 Search Report issued in International Patent Application No. PCT/JP2022/043731.

* cited by examiner

SIGNAL PROCESSOR WITH A-D CONVERTER AND RESERVOIR UNIT

TECHNICAL FIELD

The present invention relates to a signal processor.

BACKGROUND ART

A neuromorphic device is a device that imitates the human brain using a neural network. A neuromorphic device artificially imitates a relationship between neurons and synapses in the human brain.

For example, a neuromorphic device includes nodes that are hierarchically arranged (neurons in the brain) and transmission means that connect the nodes (synapses in the brain). A neuromorphic device enhances a rate of correct answers to questions by training the transmission means (synapses). Learning is finding knowledge from information which is likely to be used in the future, and a neuromorphic device weights data that it receives.

A recurrent neural network is known as one of the neural network. A recurrent neural network can handle nonlinear time-series data. Nonlinear time-series data is the data whose value changes with the elapse of time, and stock prices is one of such examples. A recurrent neural network can process time-series data by feeding processing results of neurons in a subsequent stage back to neurons in a preceding stage.

Reservoir computing is a means for realizing a recurrent neural network. Reservoir computing performs a recursive processing by having signals to interact based on the internal coupling. Reservoir computing is performed by a reservoir computer device.

Short-term memory property is one of the performance metrics required for a reservoir computer device. Short-term memory property is a criterion for determining how past information can be stored or forgotten. In general, a reservoir computer device having short-term memory property optimal for a given task, outputs an estimated solution by considering data in a required section up to the current time from time-series data and ignoring unnecessary past data older before. For example, a reservoir computer device with excellent short-term memory property outputs an estimated solution with consideration of past data in time-series data, but a reservoir computer device with poor short-term memory property outputs an estimated solution using most recent data in time-series data.

For example, it is described in Patent Document 1 that a first reservoir taking charge of short-term memory and a second reservoir taking charge of nonlinear processing are used to enhance short-term memory property of a reservoir computer device.

CITATION LIST

Patent Document

[Patent Document 1]
PCT International Publication No. WO2022/024167

SUMMARY OF INVENTION

Technical Problem

Short-term memory property and nonlinear transformation performance are known as significant aspects of performance required for a reservoir computer device, but short-term memory property and nonlinear transformation performance of the reservoir computer device have a trade-off relationship and thus it is difficult to satisfy both. Accordingly, there is a need for a new method satisfying both properties.

The present invention was made in consideration of the aforementioned circumstances and provides a signal processor for realizing a reservoir computer device having the equivalent performance as a reservoir computer device with excellent short-term memory property.

Solution to Problem (1) A signal processor according to a first aspect includes an input unit, an analog-digital converter, and a reservoir unit. The input unit receives an input of a first analog signal. The analog-digital converter converts the first analog signal to a first digital signal. The reservoir unit receives an input of at least a part of the first digital signal. The reservoir unit determines a rule of a timing at which a control signal for extracting a part of the first analog signal or the first digital signal is output.

(2) In the signal processor according to the aspect, the control signal may be input to the analog-digital converter. The analog-digital converter may change a sampling timing at which the first analog signal is converted to the first digital signal at a timing at which the control signal is input.

(3) In the signal processor according to the aspect, the control signal may be input to the analog-digital converter. The analog-digital converter may extract a part of the first digital signal.

(4) In the signal processor according to the aspect, the number of signals input to the reservoir unit in a predetermined period in response to the control signal may be equal to or less than short-term memory property of the reservoir unit.

(5) In the signal processor according to the aspect, a second analog signal may be additionally input to the input unit.

(6) The signal processor according to the aspect may further include a second analog-digital converter configured to receive an input of the second analog signal.

(7) In the signal processor according to the aspect, the reservoir unit may acquire the rule of the timing at which the control signal is output through learning under the condition that a rate of correct answers of the reservoir unit increases in a learning process.

(8) In the signal processor according to the aspect, the reservoir unit may perform reinforcement learning.

(9) In the signal processor according to the aspect, the reservoir unit may output an output target value of the reservoir unit and a likelihood of an actual output from the reservoir unit. The control signal may decrease a sampling rate in the period while the likelihood is low.

(10) In the signal processor according to the aspect, the reservoir unit may be realized as a state machine by logical circuits.

(11) In the signal processor according to the aspect, the reservoir unit may be a physical reservoir including elements or circuits.

(12) In the signal processor according to the aspect, the reservoir unit may include a first unit and a second unit. The first unit may output an estimated solution to a task. The second unit may determine the rule of a timing at which the control signal is output.

Advantageous Effects of Invention

With the signal processor and the signal processing method according to the aspects, it is possible to have the equivalent performance as a reservoir computer device with excellent short-term memory property even when short-term memory property of a reservoir computer device is low by extracting and processing a signal greatly affecting an estimated solution.

BRIEF DESCRIPTION OF DRAWINGS

FIG. 2 is a conceptual diagram of a reservoir unit according to the first embodiment.

FIG. 6 is a conceptual diagram of a signal processor according to a third embodiment.

FIG. 7 is a conceptual diagram of a signal processor according to another example of the third embodiment.

DESCRIPTION OF EMBODIMENTS

Figure 1:
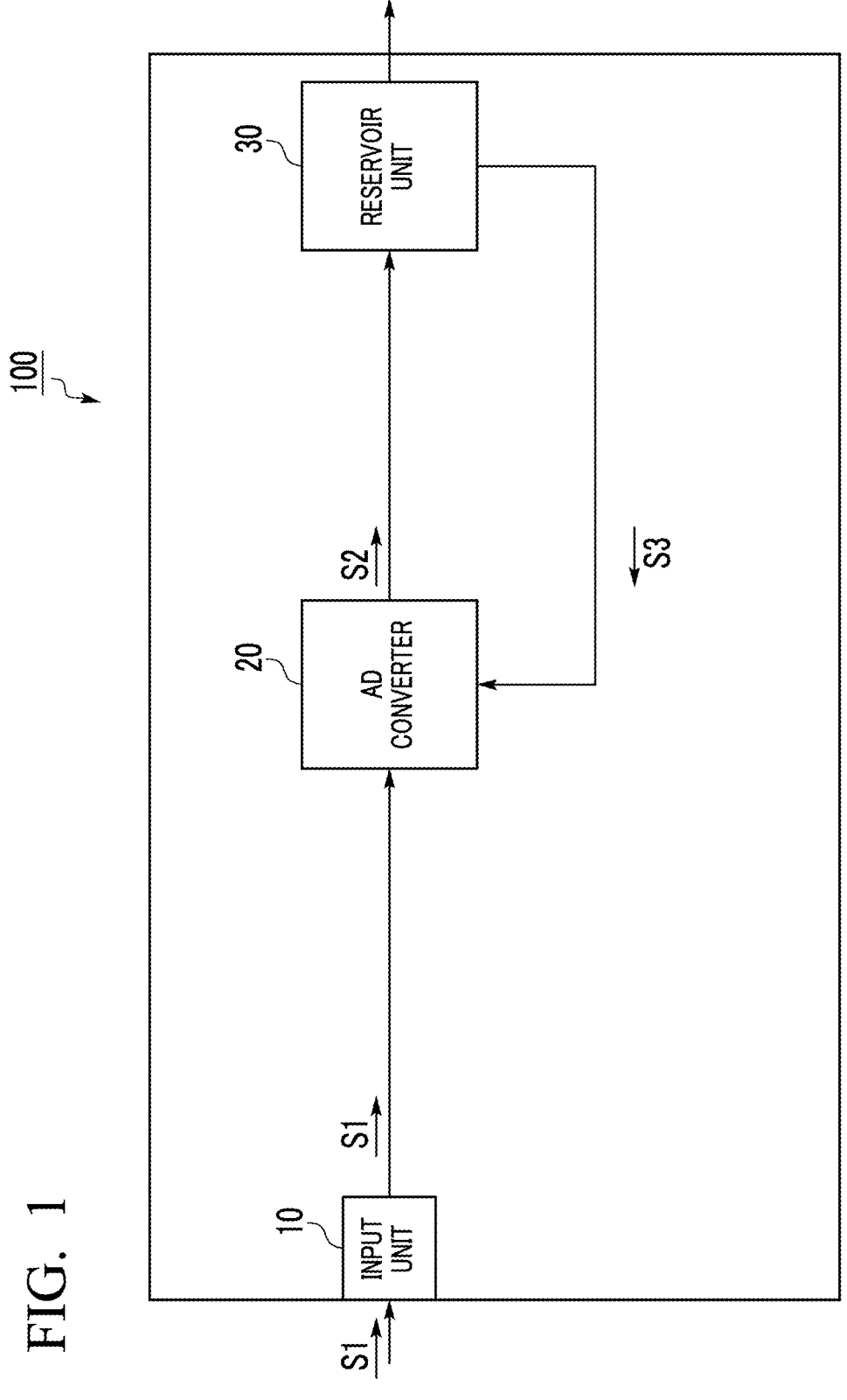
FIG. 1 is a conceptual diagram of a signal processor according to a first embodiment.

Hereinafter, embodiments of the present invention will be described in detail with reference to the accompanying drawings. In the drawings referred to in the following description, for the purpose of easy understanding of features of the present invention, featured constituents may be conveniently enlarged, and specific configurations of the constituents may be different from actual ones. Configurations exemplified in the following description are only examples, and the present invention is not limited thereto and can be appropriately modified within a range in which the advantages of the present invention are achieved.

First Embodiment

FIG. 1 is a conceptual diagram of a signal processor 100 according to a first embodiment. The signal processor 100 includes an input unit 10, an analog-digital converter 20 (hereinafter referred to as an ADC 20), and a reservoir unit 30.

The input unit 10 is an input terminal of the signal processor 100. An analog signal S1 is input to the input unit 10. The analog signal S1 is an example of a first analog signal. The input unit 10 is connected to, for example, a sensor. The input unit and the sensor may be connected in a wired manner or a wireless manner. The input unit 10 may be part of the sensor.

A known ADC can be used as the ADC 20 as long as it can convert an analog signal to a digital signal. The ADC 20 is, for example, an analog-digital conversion circuit. For example, the ADC 20 converts the analog signal S1 to a digital signal S2. The ADC 20 is connected to the input unit

10. The ADC 20 may be a part of the sensor along with the input unit 10. The sensor may include an interface that controls the ADC 20.

The reservoir unit 30 performs reservoir computing processes. The reservoir unit 30 converts an input signal nonlinearly and performs learning process and inference process.

Figure 2:
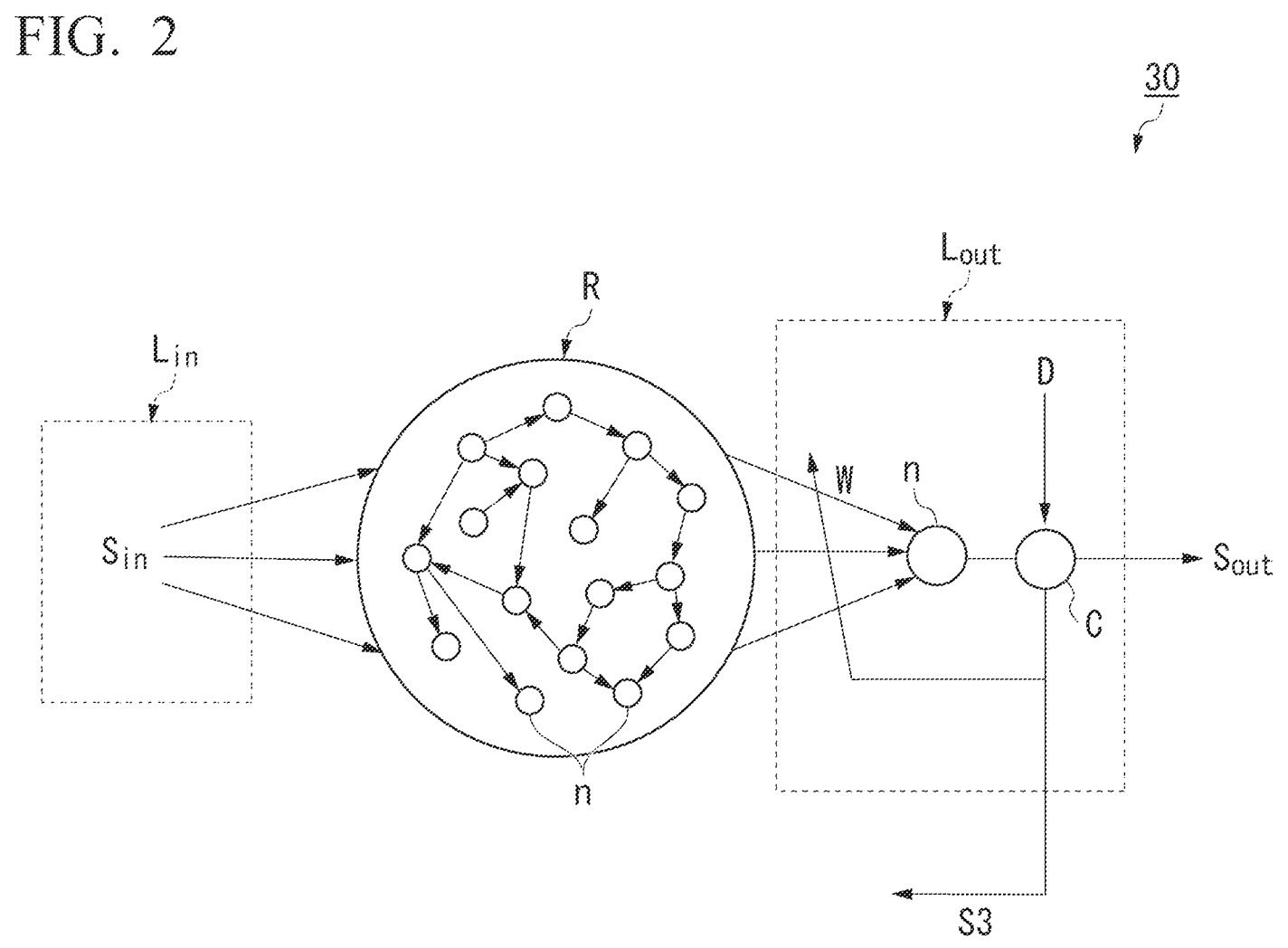

FIG. 2 is a conceptual diagram of the reservoir unit 30 according to the first embodiment. The reservoir unit 30 includes an input layer $L_{in}$, a reservoir layer R, and an output layer $L_{out}$. The input layer $L_{in}$ and the output layer $L_{out}$ are connected to the reservoir layer R.

The input layer $L_{in}$ inputs an input signal $S_{in}$ to the reservoir layer R. The input signal $S_{in}$ is, for example, a digital signal input from the ADC 20. The reservoir unit 30 may not include the input layer $L_{in}$. That is, the input signal $S_{in}$ may be input to the reservoir layer R without any change. The input signal $S_{in}$ may be weighted with a certain weight, and then the resultant signal may be input to the reservoir layer R.

The reservoir layer R stores the input signal $S_{in}$ input from the input layer $L_{in}$ and converts the input signal to another signal. The reservoir layer R includes a plurality of nodes n. In the reservoir layer R, coupling weights between the nodes n are determined, for example, as random numbers. Coupling coefficients indicating the coupling weights between the nodes n may be set, for example, such that a mutual information with a signal expected to be an output signal is maximized. An output of each node n propagates to another node n via an activation function, and the input signal $S_{in}$ changes nonlinearly in the reservoir layer R. The input signal $S_{in}$ changes with the elapse of time by interacting in the reservoir layer R. The nodes n correspond to neurons in a neural circuit, and connections between the nodes n correspond to synapses. A plurality of nodes n are randomly connected. For example, a signal output from one node n at time t may return to the node n having output the signal at time t+1. The node n can perform a process in consideration of the signals at time t and time t+1, and information is recursively processed.

The output layer $L_{out}$ receives an input of a signal from the reservoir layer R and outputs an output signal $S_{out}$ based on the signal. The output layer $L_{out}$ performs a learning process and an inference process.

In the learning process, the output layer $L_{out}$ compares the output from the reservoir layer R with training data D using a comparator C and adjusts the coupling weights w between the nodes n of the reservoir layer R and the nodes n of the output layer $L_{out}$. In the learning process, the output layer $L_{out}$ compares the output from the reservoir layer R with training data D using a comparator C and determines a rule of a timing at which the control signal S3 is output. The control signal S3 is a control signal for extracting a part of the analog signal S1 or the first digital signal. The coupling weights w and the rule of the timing at which the control signal S3 is output are acquired, for example, through learning in the learning process.

In the inference process, the output layer $L_{out}$ outputs an inference result based on the input signal $S_{in}$ input in response to the control signal S3 and the coupling weights w as the output signal $S_{out}$.

The reservoir unit 30 may be software or hardware. Software is a program installed in a computer. The reservoir unit 30 includes, for example, a memory that stores the program and a processor that executes the program. Hardware is a physical reservoir including a combination of real elements or circuits. The physical reservoir includes a plurality of circuits or elements corresponding to the nodes, which are connected to each other. The physical reservoir is formed by realizing the concept of reservoir computing using real elements or circuits. When the physical reservoir is an analog interface, the reservoir unit 30 may include a digital-analog converter. The reservoir unit 30 employing a digital circuit may be mounted in a programmable logic device (PLD) such as a field-programmable gate array (FPGA). The physical reservoir has a problem in that sufficient short-term memory property cannot be ensured, and the signal processor according to this embodiment can be suitably applied thereto.

A first operation example of the operation of the signal processor 100 will be described below. First, an analog signal S1 detected by a sensor or the like is input to the signal processor 100 via the input unit 10. The analog signal S1 is converted to a digital signal S2 by the ADC 20.

Figure 3:
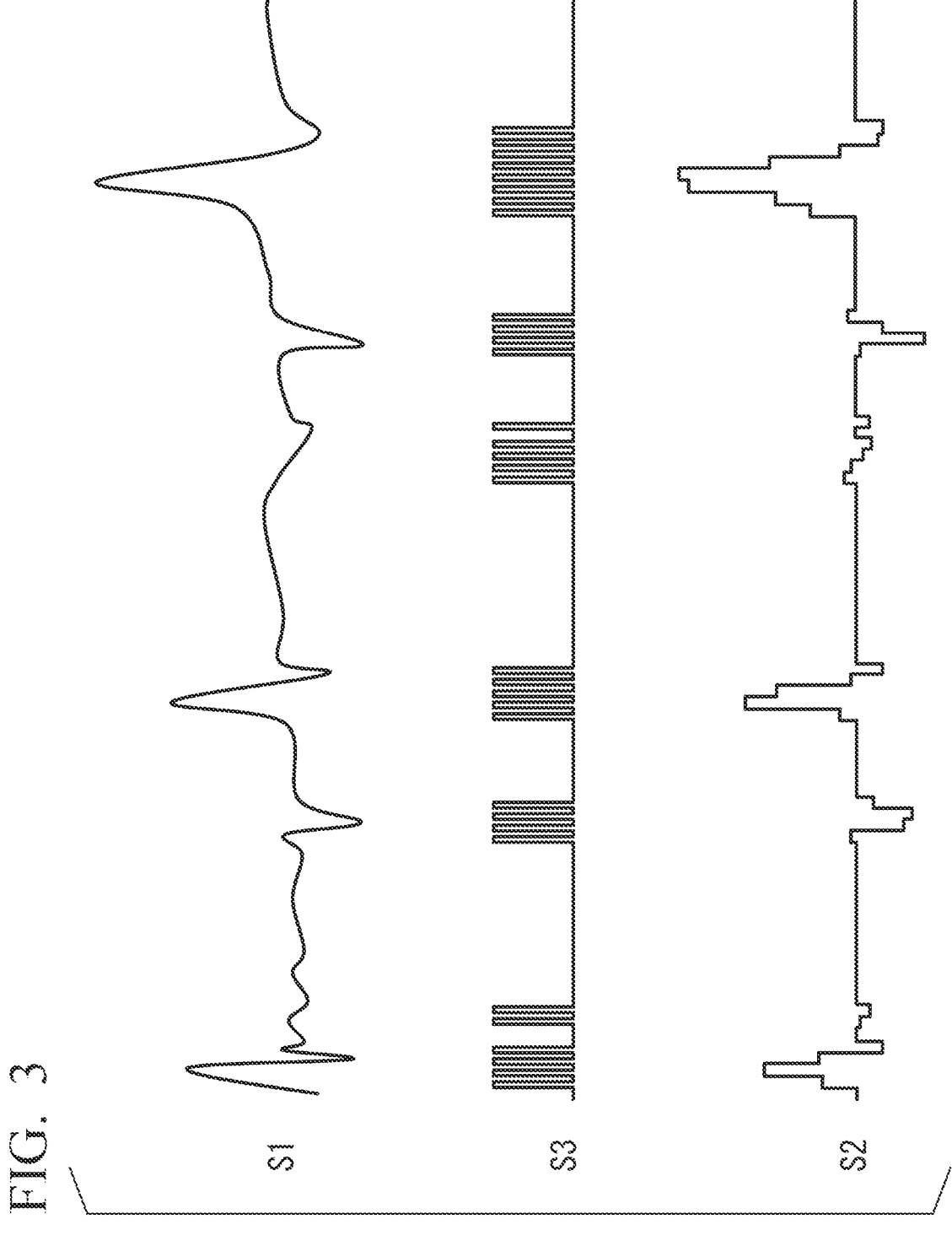
FIG. 3 is a diagram illustrating signal processing which is performed by the signal processor according to the first embodiment.

In the first operation example, the ADC 20 changes a sampling timing at which the analog signal S1 is converted to the digital signal S2 at a timing at which a control signal S3 is input. FIG. 3 is a diagram illustrating the first operation example of signal processing which is performed by the signal processor 100. As illustrated in FIG. 3, a sampling timing of the analog signal S1 is changed at the timing at which the control signal S3 is input, and a period in which the analog signal S1 is converted to the digital signal S2 changes.

The control signal S3 may be output by the reservoir unit 30 or may be output by a control unit based on a learning result in the reservoir unit 30. The control unit is connected, for example, to the ADC 20 and the reservoir unit 30. The learning result in the reservoir unit 30 is sent to the control unit, and the control unit outputs the control signal S3 to the ADC 20 based on the learning result.

The reservoir unit 30 performs a learning process and an inference process. The learning process of the reservoir unit 30 will be first described below.

The reservoir unit 30 learns at least two items in the learning process. The reservoir unit 30 learns coupling weights w between the nodes n of the reservoir layer R and the nodes n of the output layer $L_{out}$ as a first item. The reservoir unit 30 learns a rule of an output timing of the control signal S3 as a second item.

Learning of the first item in the reservoir unit 30 will be first described. The reservoir unit 30 outputs a specific output signal $S_{out}$ when a specific coupling weight w is set. By learning a combination of the coupling weight w and the output signal $S_{out}$ while changing the coupling weight w, the reservoir unit 30 learns the first item.

For example, the reservoir unit 30 learns the first item to satisfy the condition that a rate of correct answers of the reservoir unit 30 increases. The rate of correct answers of the reservoir unit 30 is, for example, a degree of coincidence between training data D and the output signal $S_{out}$. It can be said that the rate of correct answers of the reservoir unit 30 becomes higher as the degree of coincidence between the training data D and the output signal $S_{out}$ becomes higher. For example, the reservoir unit 30 outputs an output target value (training data) of the reservoir unit 30 and a likelihood of an actual output (the output signal $S_{out}$) from the reservoir unit 30. The output signal $S_{out}$ is more likely to be correct as the likelihood becomes higher, and the rate of correct answers of the reservoir unit 30 increases.

Learning of the second item in the reservoir unit 30 will be described below. The ADC 20 converts the analog signal S1 to the digital signal S2 based on the control signal S3. When a period in which the analog signal S1 is converted to the digital signal S2 is changed in accordance with the control signal S3, the input signal $S_{in}$ input to the reservoir unit 30 changes. When the coupling weight w is fixed, the reservoir unit 30 outputs a specific output signal $S_{out}$ when a specific input signal $S_{in}$ is input. By learning a combination of the input signal $S_{in}$ and the output signal $S_{out}$ while changing the input signal $S_{in}$, the reservoir unit 30 learns the second item. The input signal $S_{in}$ can be changed by changing the control signal S3 to change the timing or period in which the analog signal S1 is converted to the digital signal S2.

For example, the reservoir unit 30 learns the second item to satisfy the condition in which the rate of correct answers of the reservoir unit 30 increases and determines a rule of a timing at which a sampling control signal is output. For example, the reservoir unit 30 outputs a likelihood between an output target value (training data) of the reservoir unit 30 and an actual output (output signal $S_{out}$) from the reservoir unit 30. The control signal S3 may decrease a sampling rate in a period during a low likelihood.

The number of signals input to the reservoir unit in a predetermined period in response to the control signal S3 is, for example, equal to or less than short-term memory property of the reservoir unit 30. The predetermined period is, for example, a time corresponding to an interval (period) of an output signal $S_{out}$ to be detected. A time in which the input signal $S_{in}$ can theoretically affect a signal to be detected or the like may be set as the predetermined period. The reservoir unit 30 stores past information corresponding to the short-term memory property and operates. By curbing the number of signals input to the reservoir unit 30 in a predetermined period to be equal to or less than short-term memory property, it is possible to efficiently perform computing while sufficiently inputting necessary information to the reservoir unit 30.

Here, the short-term memory property which is an evaluation index of the reservoir unit 30 represents on how past information the state of the reservoir unit 30 in response to input time-series signals depends. The short-term memory property is expressed by an index such as a memory capacity (MC).

For example, regarding a task considering past information such as a parity task, when a maximum delay length with which the task is likely to succeed is defined as k, a degree of coincidence between a delay sequence (a delay time series) of the delay length k and an output series (an output time series) of a trained model can be expressed by a determination coefficient below. Here, the delay length k is a time by which an output signal is delayed with respect to an input signal through processing of the reservoir unit 30.

[Math. 1]

$$r^2(k) = \frac{\text{Cov}^2(u(n-k), \hat{y}_k(n))}{\text{Var}(u(n)) \cdot \text{Var}(\hat{y}_k(n))} \tag{1}$$

Here, n is a time step, $\hat{y}_k(k)$ is an output of the reservoir unit 30 in the time step n when the delay length is k, and Cov(•,•) is covariance. When the delay series is completely restored (reproduced) by the reservoir unit 30, $r^2(k)$ represents a value of 1. The memory capacity MC is a sum of the determination coefficients $r^2(k)$ with respect to the delay length k and is expressed as follows.

[Math. 2]

$$MC = \overline{\sum_{k=1}^{\infty} r^2(k)} \qquad (2)$$

On the other hand, for example, when reservoir computing is realized by a physical device, the memory capacity is often limited due to constraints in characteristics of physical phenomena, a device structure, and the like. In this case, when a signal of the sensor or the like is input to the reservoir unit 30 having the memory capacity MC without processing, redundant signals included in the sensor signal are input to the reservoir unit 30, and thus the limited memory capacity MC of the reservoir unit 30 cannot be utilized.

The short-term memory property (the memory capacity MC) expressed by Expression (2) is acquired by calculating a sum of correlations (mutual information) of a value output from the series and a preferable value over all the delay steps in processing the time-series signals. The short-term memory property expressed by Expression (2) can be suitably used to compare latent short-term memory property of the reservoir unit 30.

On the other hand, when the reservoir unit 30 is applied to a real task, the short-term memory property expressed by Expression (2) may not work as an appropriate index. For example, when the reservoir unit 30 is applied to a real task, bigger memory capacity MC is not always better. In order to form a feature space required for the task, it is preferable that the reservoir unit 30 store necessary past series and forget the other past series. That is, it is important for the reservoir unit 30 to have appropriate short-term memory property for a target task, and it is important to have short-term memory property appropriate for a specific delay length (for example, T. Hulser et al, Nanophotnics 2023; 12(5): 937-947 "Deriving task specific performance from the information processing capacity of a reservoir computer" October 2022 and T. L. Carroll, "Optimizing Memory in Reservoir Computers", January 2022).

That is, when a real task is assumed, the short-term memory property required for the task is a memory capacity for a necessary delay length. For example, it is necessary to adjust a sampling frequency such that the sampling frequency from a section of an input signal affecting task performance in a range of the delay length is maximized. That is, it is necessary to adjust the sampling counts acquired from a series of input signals to satisfy short-term memory property required for solving the real task. In this case, the short-term memory property is expressed by one of Expressions (3) to (5).

[Math. 3]

$$MC(k) = r^2(k) \qquad (3)$$

[Math. 4]

$$MC = \overline{\sum_{k=1}^{\infty} a_k \cdot r^2(k)} \qquad (4)$$

[Math. 5]

$$\overline{\phantom{MC}}$$

-continued $$MC = \sum_{k=1}^{n} r^2(k) \qquad (5)$$

As described above, the short-term memory property may be expressed by Expression (2) or may be expressed by one of Expressions (3) to (5). The short-term memory property expressed by one of Expressions (3) to (5) can be suitably used to solve the real task. The short-term memory property expressed by one of Expressions (3) to (5) is a partial memory capacity corresponding to the delay length required for the corresponding task.

For example, after learning the first item and optimizing the coupling weights w, the reservoir unit 30 learns the second item by reducing the timing at which the control signal S3 is output in a range in which the rate of correct answers of the reservoir unit 30 does not decrease greatly. For example, after learning the second item by reducing the timing at which the control signal S3 is output in a range in which the rate of correct answers of the reservoir unit 30 does not decrease greatly, the reservoir unit 30 may learn the first item by optimizing the coupling weights. For example, the reservoir unit 30 may compute optimal values while simultaneously changing two parameters of the input signal $S_{in}$ (the sampling timing based on the control signal S3) and the coupling weight W.

An example of supervised learning in which the reservoir unit 30 learns optimal values through comparison between the training data D and the output signal $S_{out}$ has been described above, but the learning process is not limited thereto. For example, the reservoir unit 30 may perform unsupervised learning or reinforcement learning. When reinforcement learning is performed, an index in which favorability of an output from the reservoir unit 30 (for example, an error (a root mean square error (RMSE)) with respect to a given learning signal) and a sampling frequency are combined is used as an objective function (a score). In this case, scales of the index may be adjusted through standardization or the like. The reservoir unit 30 learns behavior (a sampling timing) such that the score is minimized and determines whether the sampling control signal 3 is to be output at the corresponding timings. When reinforcement learning is used, a technique of defining a reward for an output state and behavior (for example, behavior of sampling or not sampling) and updating the behavior is known. The reinforcement learning includes deep reinforcement learning. That is, the reservoir unit 30 determines a rule of the output timing of an optimal sampling control signal 3. The sampling timing may be adaptively learned with a change in operating environment of a reservoir using online learning.

Learning of the reservoir unit 30 is performed using data obtained at preset (sufficiently short) sampling intervals. With the data randomly decimated from data sampled at this sampling intervals, learning of the first item may be performed, and the result thereof may be used as training data. The minimum sampling frequency with which target performance can be achieved may be computed by a computer or the like and the result thereof may be set in the reservoir unit 30. The reservoir unit 30 may learn to return to a pre-change sampling timing by post-change sampling data after having changed the sampling timing based on the control signal S3.

The inference process which is performed by the reservoir unit 30 will be described below. The inference process is performed with a combination of the coupling weight w optimized through the learning process and the output timing of the control signal S3. In the inference process, the rule for determining the coupling weight w and the output timing of the control signal S3 is not changed in principle. The reservoir unit 30 outputs an estimated solution according to conditions learned in the learning process.

The first operation example of the operation of the signal processor 100 has been described above, but the operation of the signal processor 100 is not limited to this example.

Figure 4:
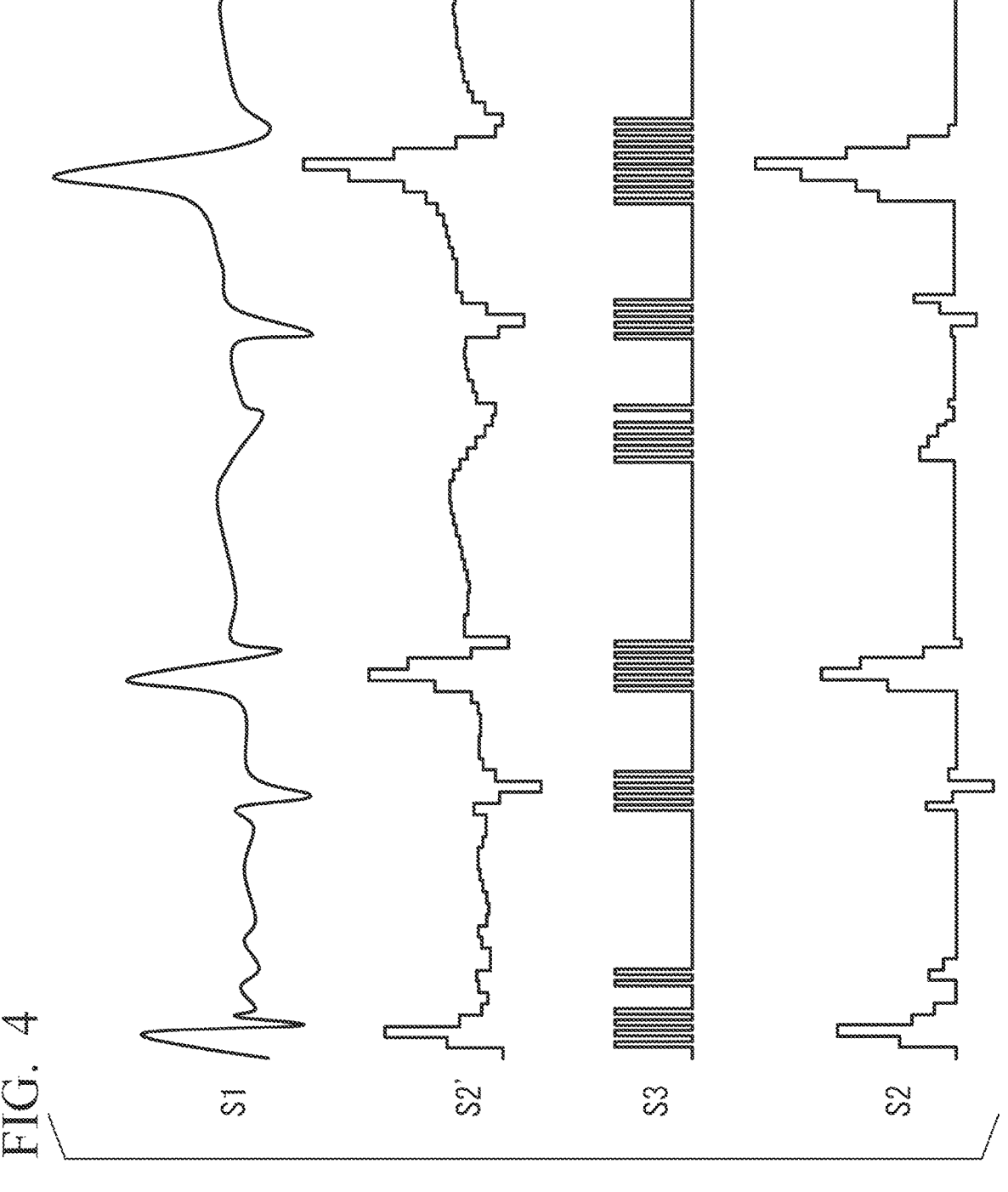
FIG. 4 is a diagram illustrating another example of signal processing which is performed by the signal processor according to the first embodiment.

FIG. 4 is a diagram illustrating a second operation example of signal processing which is performed by the signal processor 100. As illustrated in FIG. 4, the ADC 20 may convert all input analog signals S1 to a digital signal S2'. Then, the ADC 20 may extract a digital signal S2 from the digital signal S2' at a timing at which the control signal S3 is input. That is, the signal processor 100 may temporarily convert the analog signal S1 to the digital signal S2' and then extract a part of the digital signal S2'. The control signal S3 used herein is a signal for instructing to mask a part of a signal.

The control signal S3 may be output by the reservoir unit 30 or may be output by the control unit based on the learning result in the reservoir unit 30. The control unit is connected, for example, to the ADC 20 and the reservoir unit 30. The learning result in the reservoir unit 30 is sent to the control unit, and the control unit outputs the control signal S3 to the ADC 20 based on the learning result. The rule of the timing at which the control signal S3 is output is determined by the reservoir unit 30 through learning as same as the first operation example.

As described above, the signal processor 100 according to the first embodiment can minimize an amount of signals input to the reservoir unit 30 by converting a part of the analog signal S1 input to the signal processor 100 to a digital signal S2.

In reservoir computing, signals input to the reservoir layer R include signals greatly affecting an estimated solution and signals little affecting the estimated solution. The signal processor 100 according to the first embodiment extracts the signals greatly affecting the estimated solution by extracting a part of the signals. Since the reservoir unit 30 stores only the signals greatly affecting the estimated solution for a short term, it is possible to store information equivalent to that when the short-term memory property is high.

Accordingly, even when the short-term memory property of the reservoir unit 30 is low, the signal processor 100 according to the first embodiment can exhibit performance equivalent to that when the short-term memory property is high.

The signal processor 100 according to the first embodiment determines the rule for extracting some signals by training the reservoir unit 30. Accordingly, an arbitrary decision by persons is not involved in determination of the rule for extracting the signals and it is possible to more appropriately extract signals greatly affecting an estimated solution.

Second Embodiment

Figure 5:
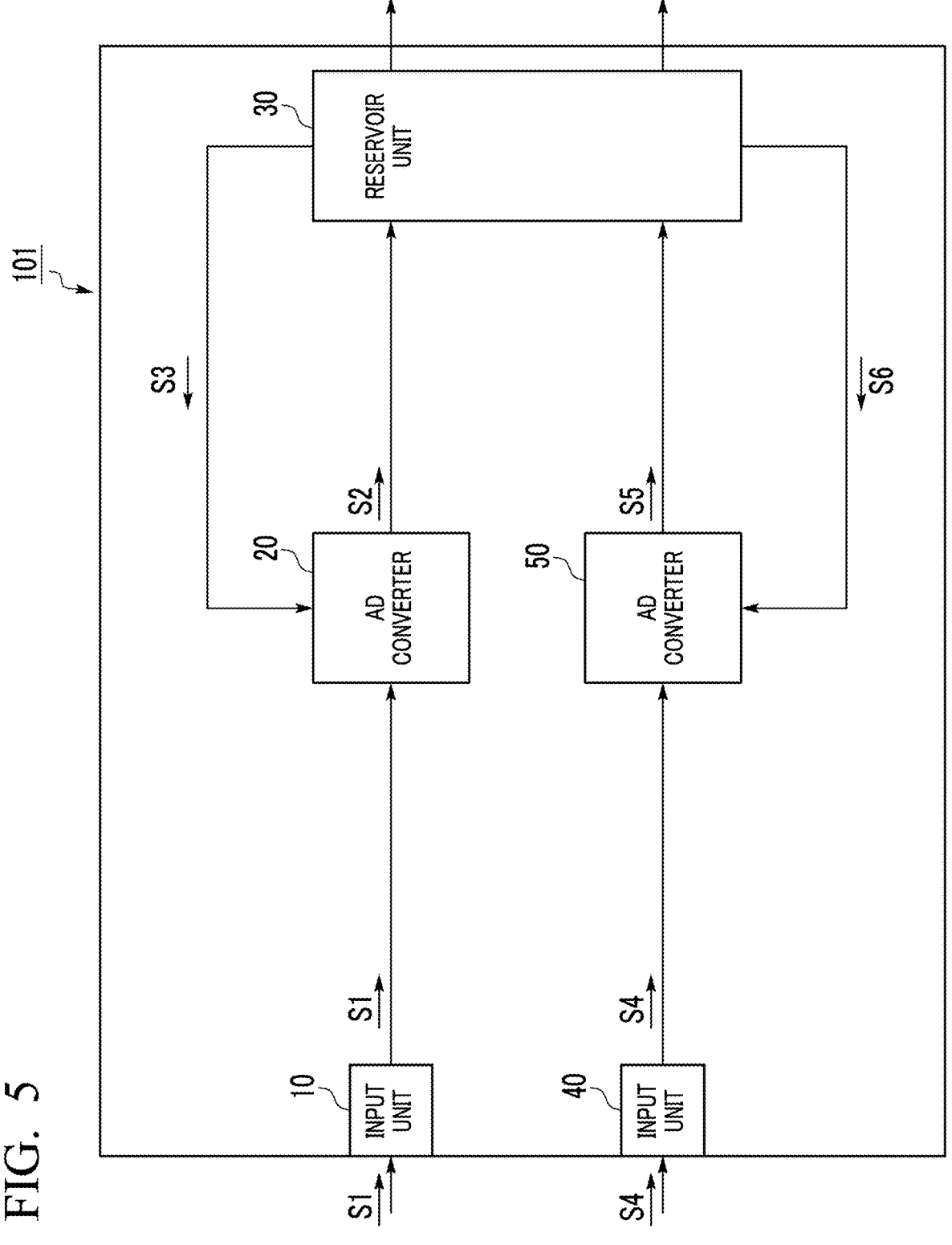
FIG. 5 is a conceptual diagram of a signal processor according to a second embodiment.

FIG. 5 is a conceptual diagram of a signal processor 101 according to a second embodiment. The signal processor 101 includes an input unit 10, an input unit 40, an ADC 20, an analog-digital converter 50 (hereinafter referred to as an ADC 50), and a reservoir unit 30. The signal processor 101 according to the second embodiment is different from the signal processor 100 according to the first embodiment in that the input unit 40 and the ADC 50 are provided.

In the signal processor 101, the input unit 10, the ADC 20, and the reservoir unit 30 are the same as those in the signal processor 100 according to the first embodiment.

The input unit 40 is a second input terminal of the signal processor 101. An analog signal S4 is input to the input unit 40. The analog signal S4 is an example of a second analog signal. The input unit 40 is connected to, for example, a sensor. The input unit 40 and the sensor may be connected in a wired manner or a wireless manner. Unlike the analog signal S1, the analog signal S4 is a result of sensing a different parameter other than the analog signal S1. The input unit 40 may be part of the sensor.

The same configuration as the ADC 20 can be selected by the ADC 50 as long as it can convert an analog signal to a digital signal. For example, the ADC 50 converts the analog signal S4 to a digital signal S5. The ADC 50 may change a sampling timing at which the analog signal S4 is converted to the digital signal S5 at a timing at which a control signal S6 is input from the reservoir unit 30 or extract a part of the digital signal to which the analog signal S4 is converted as the digital signal S5. The ADC 50 is connected, for example, to the input unit 40. The ADC 50 may be a part of the sensor along with the input unit 40. The sensor may include an interface that controls the ADC 50.

The ADC 50 receives an input of the control signal S6 from the reservoir unit 30. The control signal S6 is a control signal for extracting the digital signal S5 from the analog signal S4. The control signal S6 is, for example, a signal for instructing a sampling timing at which the analog signal S4 is converted to the digital signal S5. The control signal S6 may be a signal for instructing to mask a part of the digital signal S5 to which the analog signal S4 is converted.

The control signal S6 may be output by the reservoir unit 30 or may be output by a control unit based on a learning result in the reservoir unit 30. The control unit is connected, for example, between the ADC 50 and the reservoir unit 30. The learning result in the reservoir unit 30 is sent to the control unit, and the control unit outputs the control signal S6 to the ADC 20 based on the learning result.

The rule of the output timing of the control signal S6 is determined in a learning process by the reservoir unit 30. This learning is performed in the same way as determining the rule of the output timing of the control signal S3 in the first embodiment. The number of signals input to the reservoir unit 30 in a predetermined period in response to the control signal S6 is set, for example, to be equal to or less than the short-term memory property of the reservoir unit 30.

The signal processor 101 according to the second embodiment can achieve advantageous effects equivalent to those of the signal processor 100 according to the first embodiment. When the number of analog signals input to the signal processor 101 is two or more, more information is input to the reservoir unit 30 and thus the reservoir unit 30 can perform more advanced processing.

In the signal processor 101 according to the second embodiment, two analog signals S1 and S4 are input to the signal processor 101, but the number of analog signals input to the signal processor 101 may be three or more. That is, the signal processor may include three or more input units and three or more analog-digital converters. In the signal processor, a plurality of input units may be connected to one analog-digital converter. For example, the signal processor may include a plurality of input units and one analog-digital converter. In this case, the analog-digital converter processes analog signals from each input units.

Third Embodiment

Figure 6:
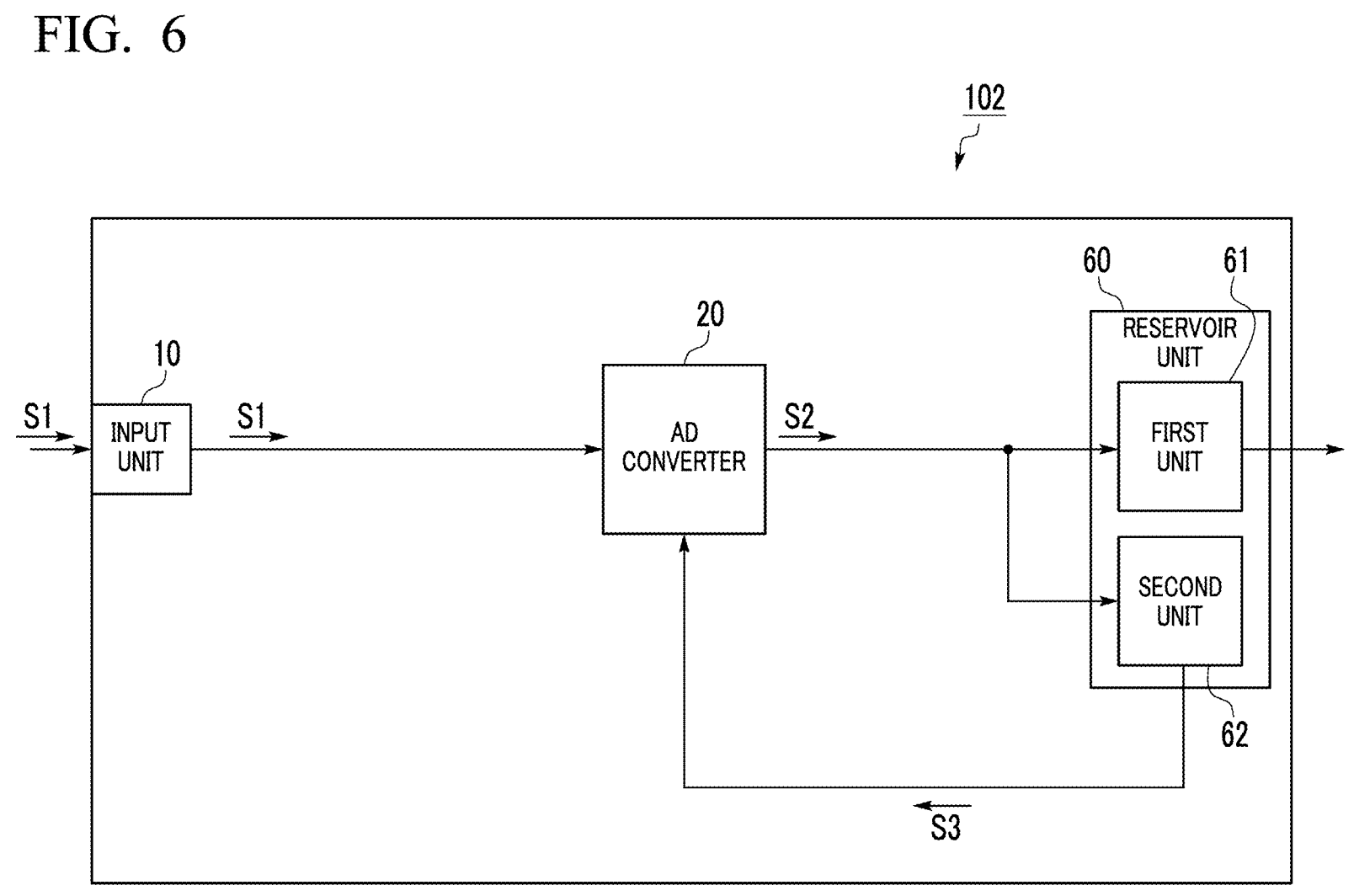

FIG. 6 is a conceptual diagram of a signal processor 102 according to a third embodiment. The signal processor 101 includes an input unit 10, an ADC 20, and a reservoir unit 60. The reservoir unit 60 includes a first unit 61 and a second unit 62. The signal processor 102 according to the third embodiment is different from the signal processor 100 according to the first embodiment in the configuration of the reservoir unit 60.

The reservoir unit 60 performs a reservoir computing process. The reservoir unit 60 nonlinearly converts an input signal and performs a learning process and an inference process. The reservoir unit 60 has the same configuration as the reservoir unit 30 except that units are divided according to functions.

The reservoir unit 60 learns at least two items in the learning process. The reservoir unit 60 learns coupling weights w between the nodes n of the reservoir layer R and the nodes n of the output layer $L_{out}$ as the first item. The reservoir unit 60 learns a rule of an output timing of a control signal S3 as the second item. The first unit 61 work for the first item, and the second unit 62 work for the second item.

The first unit 61 optimizes the coupling weights w between the nodes n of the reservoir layer R and the nodes n of the output layer $L_{out}$ in the learning process and outputs an estimated solution to a task in the inference process. On the other hand, the second unit 62 optimizes the rule of the output timing of the control signal S3 in the learning process.

The signal processor 102 according to the third embodiment achieves the same advantageous effects as the signal processor 100 according to the first embodiment. Since the signal processor 102 divides the units by the items to be learned, processing by the reservoir unit 60 becomes more efficient.

In the signal processor 102 according to the third embodiment, the reservoir unit 60 is divided into two units according to the functions, but the number of units may be three or more. The configuration of the signal processor 102 according to the third embodiment may be combined with the configuration of the signal processor 101 according to the second embodiment. For example, the reservoir unit may be divided into sub units to correspond to each input analog signals.

In the signal processor 102 illustrated in FIG. 6, the two units of the reservoir unit 60 corresponding to the functions are connected in parallel, but an output value of the first unit 61 may be connected as an input of the second unit 62.

Figure 7:
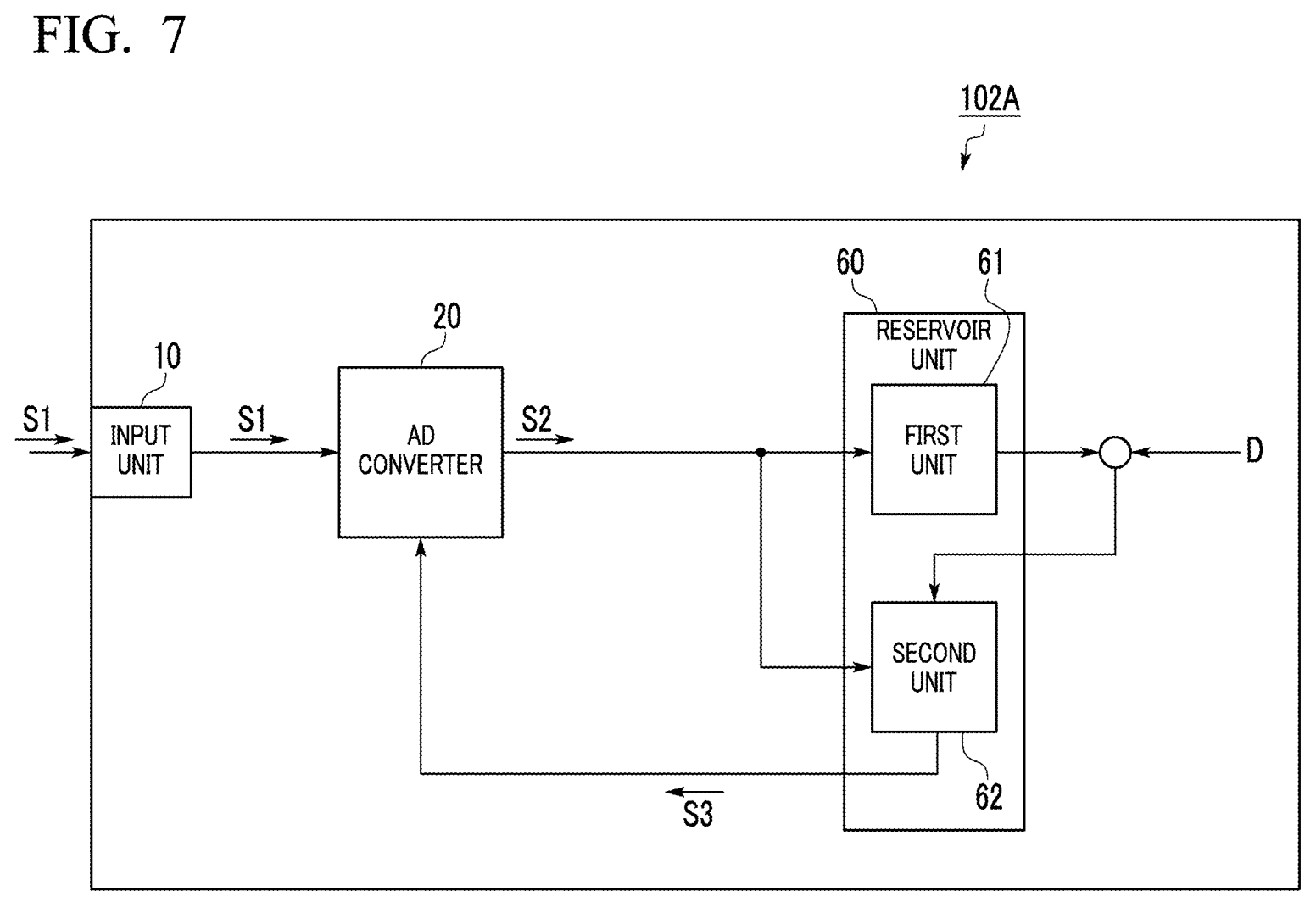

As illustrated in FIG. 7, a difference between the output value of the first unit 61 and the training data D may be used as an input of the second unit 62. FIG. 7 is a conceptual diagram of a signal processor 102A according to another example of the third embodiment. In this case, learning of the second unit 62 is performed to minimize the difference and to acquire a sampling timing having minimum sampling count.

While embodiments of the present invention have been described above in detail with reference to the drawings, the configurations of the embodiments, combinations thereof, and the like are merely examples and can be subjected to additions, omissions, replacements, and other modifications of elements without departing from the gist of the present invention.

In order to further improve performance of the signal processors according to the embodiments, optimization of the coupling weights in the reservoir layer R, the activation function, and coupling topology between the nodes n and the like are conceivable. For the purpose of this optimization, optimization of a distribution (a probability distribution) using an information criterion or the like is conceivable.

In the signal processors according to the embodiments, after the sampling timing based on the control signal S3 has been acquired through learning, learning may be additionally performed using only data acquired at a changed sampling timing.

REFERENCE SIGNS LIST

10 Input unit
20, 50 Analog-digital converter (ADC)
30, 60 Reservoir unit
61 First unit
62 Second unit
100, 101, 102 Signal processor
S1, S4 Analog signal
S2, S2', S5 Digital signal
S3, S6 Control signal
The invention claimed is:

1. A signal processor comprising:
an input unit configured to receive an input of a first analog signal;
an analog-digital converter configured to convert the first analog signal to a first digital signal; and
a reservoir unit configured to receive an input of at least a part of the first digital signal,
wherein the analog-digital converter is connected to each of the input unit and the reservoir unit and receives and converts the first digital signal from the input unit, and
wherein the reservoir unit determines by learning a rule of a timing at which a control signal for extracting a part of the first analog signal or the first digital signal is output
wherein the control signal is input to the analog-digital converter, and
wherein the analog-digital converter changes a sampling timing at which the first analog signal is converted to the first digital signal at a timing at which the control signal is input.

2. The signal processor according to claim 1, wherein a second analog signal is additionally input to the input unit.

3. The signal processor according to claim 2, further comprising a second analog-digital converter configured to receive an input of the second analog signal.

4. The signal processor according to claim 1, wherein the reservoir unit acquires the rule of the timing at which the control signal is output through learning under the condition that a rate of correct answers of the reservoir unit increases in a learning process.

5. The signal processor according to claim 1, wherein the reservoir unit performs reinforcement learning.

6. The signal processor according to claim 1, wherein the reservoir unit outputs an output target value of the reservoir unit and a likelihood of an actual output from the reservoir unit and the control signal decreases a sampling rate in the period while the likelihood is low.

7. The signal processor according to claim 1, wherein the reservoir unit is a state machine by logical circuits.

8. The signal processor according to claim 1, wherein the reservoir unit is a physical reservoir including elements or circuits.

9. The signal processor according to claim 1, wherein the reservoir unit includes a first unit and a second unit, wherein the first unit outputs an estimated solution to a task, and wherein the second unit determines the rule of a timing at which the control signal is output.

10. A signal processor comprising:

an input unit configured to receive an input of a first analog signal;

an analog-digital converter configured to convert the first analog signal to a first digital signal; and a reservoir unit configured to receive an input of at least a part of the first digital signal, wherein the analog-digital converter is connected to each of the input unit and the reservoir unite and receives and converts the first digital signal from the input unit, wherein the reservoir unit determines by learning a rule of a timing at which a control signal for extracting a part of the first analog signal or the first digital signal is output, wherein the control signal is input to the analog-digital converter, and wherein the analog-digital converter extracts a part of the first digital signal.

11. The signal processor according to claim 10, wherein a second analog signal is additionally input to the input unit.

12. The signal processor according to claim 11, further comprising a second analog-digital converter configured to receive an input of the second analog signal.

13. The signal processor according to claim 10, wherein the reservoir unit acquires the rule of the timing at which the control signal is output through learning under the condition that a rate of correct answers of the reservoir unit increases in a learning process.

14. The signal processor according to claim 10, wherein the reservoir unit performs reinforcement learning.

15. The signal processor according to claim 10, wherein the reservoir unit outputs an output target value of the reservoir unit and a likelihood of an actual output from the reservoir unit and the control signal decreases a sampling rate in the period while the likelihood is low.

16. The signal processor according to claim 10, wherein the reservoir unit is a state machine by logical circuits.

17. The signal processor according to claim 10, wherein the reservoir unit is a physical reservoir including elements or circuits.

18. The signal processor according to claim 10, wherein the reservoir unit includes a first unit and a second unit, wherein the first unit outputs an estimated solution to a task, and wherein the second unit determines the rule of a timing at which the control signal is output.

19. A signal processor comprising:

an input unit configured to receive an input of a first analog signal;

an analog-digital converter configured to convert the first analog signal to a first digital signal; and a reservoir unit configured to receive an input of at least a part of the first digital signal, wherein the analog-digital converter is connected to each of the input unit and the reservoir unite and receives and converts the first digital signal from the input unit, wherein the reservoir unit determines by learning a rule of a timing at which a control signal for extracting a part of the first analog signal or the first digital signal is output, and wherein the number of signals input to the reservoir unit in a predetermined period in response to the control signal is equal to or less than short-term memory property of the reservoir unit.

* * * * *